United States Patent [19]

Jain et al.

[11] Patent Number: 5,665,296
[45] Date of Patent: Sep. 9, 1997

[54] MOLDING TECHNIQUE FOR MOLDING PLASTIC PACKAGES

[75] Inventors: Praveen Jain, Gilbert; Rudra Kar, Mesa, both of Ariz.

[73] Assignee: Intel Corporation, Santa Clara, Calif.

[21] Appl. No.: 571,038

[22] Filed: Dec. 12, 1995

Related U.S. Application Data

[63] Continuation of Ser. No. 217,412, Mar. 24, 1994, abandoned.

[51] Int. Cl.⁶ .................................................. B29C 45/14
[52] U.S. Cl. .............................. 264/272.15; 264/272.17; 425/116
[58] Field of Search ........................ 264/328.12, 272.17, 264/272.15, 328.8; 425/557, 544, 572, 573, 116, 129.1, 130

[56] References Cited

U.S. PATENT DOCUMENTS

| | | | |
|---|---|---|---|
| 4,301,464 | 11/1981 | Otsuki et al. ............................. | 357/70 |
| 4,556,896 | 12/1985 | Meddies ................................. | 264/272.17 |
| 4,641,418 | 2/1987 | Meddles ................................. | 264/328.12 |
| 5,137,479 | 8/1992 | Ohikata et al. .......................... | 264/272.17 |
| 5,197,183 | 3/1993 | Chia et al. ............................. | 264/328.12 |
| 5,204,122 | 4/1993 | Konishi ................................. | 264/272.17 |
| 5,275,546 | 1/1994 | Fierkens ............................... | 264/272.17 |
| 5,368,805 | 11/1994 | Motai .................................. | 264/272.17 |
| 5,371,044 | 12/1994 | Yoshida et al. ........................ | 264/272.17 |

FOREIGN PATENT DOCUMENTS

| | | | |
|---|---|---|---|
| 62-261414 | 11/1987 | Japan ................................. | 425/544 |
| 2-81615 | 3/1990 | Japan ................................. | 425/544 |

*Primary Examiner*—Angela Ortiz
*Attorney, Agent, or Firm*—Blakely, Sokoloff, Taylor & Zafman

[57] ABSTRACT

A method for assembling a plastic integrated circuit package. The method includes placing an integrated circuit die and lead frame into a mold. The mold has a first gate that is in fluid communication with a first side of the lead frame and a second opposite gate which is in fluid communication with a second side of the lead frame. The lead frame also has a mold flow hole adjacent to the gates. A plastic encapsulant is injected into both gates and flows across each side of the lead frame. The mold flow opening allows encapsulant to flow between each side of the lead frame.

1 Claim, 2 Drawing Sheets

MOLDING TECHNIQUE FOR MOLDING PLASTIC PACKAGES

This is a Continuation application of application Ser. No. 08/217,412, filed Mar. 24, 1994 now abandoned.

BACKGROUND OF THE INVENTION

1. Field of the Invention

The present invention relates to an integrated circuit package.

2. Description of Related Art

Integrated circuits are typically housed within a plastic package commonly referred to as a quad flat pack (QFP). Flat packs contain a lead frame which has a plurality leads that are connected to an integrated circuit die. The die is encapsulated by a hard plastic housing which mechanically supports and electrically insulates the integrated circuit. The leads are typically soldered to a printed circuit board.

The package is assembled by placing the die and lead frame into a mold and then injecting a plastic encapsulant into the mold cavity. The encapsulant is typically injected through a single gate located at one corner of the mold cavity. Encapsulant flows through the gate, into the mold cavity and across one side of the lead frame. The injected plastic also flows through the spaces between the leads of the lead frame and across the opposite side of the integrated circuit to totally encapsulate the IC die.

The pressure of the injected plastic must be high enough to push the encapsulant through the lead frame openings and fill the entire mold cavity. Relatively small lead frame spacing creates corresponding thin openings between the leads. The smaller openings increase the fluid resistance of the encapsulant. Higher injection pressures must be supplied to overcome the increase in fluid resistance. It has been found that relatively high injection pressures may cause an undesirable deflection of the lead frame. It would therefore be desirable to have a method of injecting encapsulant into the mold of an integrated circuit package, which requires a lower injection pressure than methods in the prior art.

SUMMARY OF THE INVENTION

The present invention is a method for assembling a plastic integrated circuit package. The method includes placing an integrated circuit die and lead frame into a mold. The mold has a first gate that is in fluid communication with a first side of the lead frame and a second opposite gate which is in fluid communication with a second side of the lead frame. The lead frame also has a mold flow hole adjacent to the gates. A plastic encapsulant is injected into both gates and flows across each side of the lead frame. The mold flow opening allows encapsulant to flow between each side of the lead frame. The combination of dual gates and a mold flow opening allows the encapsulant to easily flow across each side of the lead frame, and lowers the fluid resistance and corresponding injection pressure required to fill the mold cavity.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
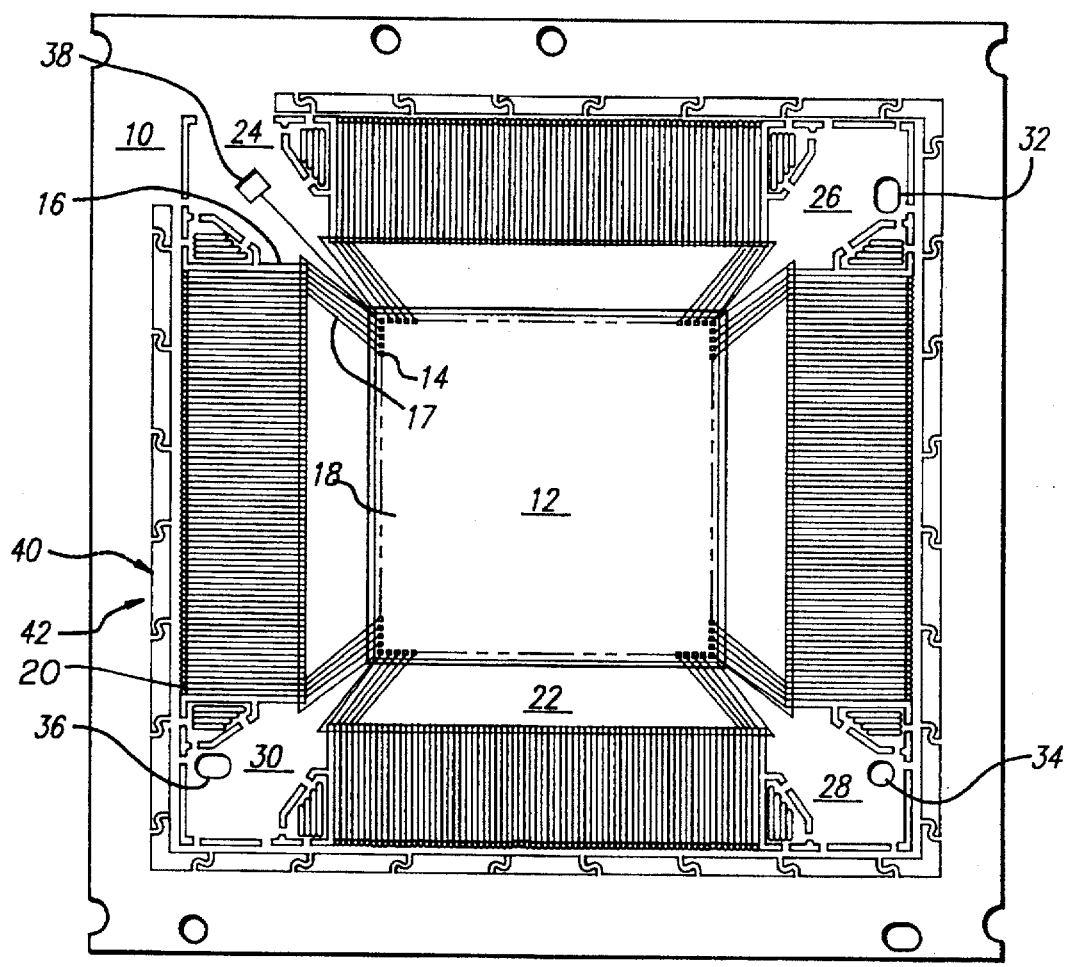
FIG. 1 is a top view of an integrated circuit die mounted to a lead frame of the present invention.

Referring to the drawings more particularly by reference numbers, FIG. 1 shows a lead frame 10 of the present invention. The lead frame 10 is coupled to an integrated circuit die 12. The die 12 may be a conventional integrated circuit such as a microprocessor. Although a microprocessor is described, it is to be understood that the die 12 may be any type of electronic device.

The die 12 has a plurality of outer surface pads 14 which provide the output pins of the integrated circuit. The surface pads 14 are coupled to a plurality of leads 16 of the lead frame 10 by the conductors of a TAB (tape automated bonding) tape 18. The conductors 17 of the TAB tape 18 are bonded to a dielectric tape material which provides structural integrity and allows the tape to be assembled to the die 12 and lead free 10 in an automated manner. Alternatively, the die 12 can be coupled to the lead frame 10 by other conventional techniques such as wire bonding.

The leads 16 of the lead frame 10 are separated by gaps 20 that isolate each individual lead 16. In the preferred embodiment, the leads 16 are on 0.4 millimeters spacing. After the outer plastic housing is formed, the leads 16 are typically bent into a gull wing configuration. The leads 16 are then soldered to a printed circuit board (not shown), thereby coupling the integrated circuit 12 to the board.

The die 12 is mounted to a die paddle portion 22 of the lead frame 10. The die paddle 22 may function as a ground plane in the final assembled package. The lead frame 10 also has four corner portions 24–30 at the corners of the frame 10. Corner portions 26–30 contain alignment holes 32–36 that receive alignment pins and align the lead frame 10 within a tester (not shown). Alignment hole 34 is circular in shape and provides a zero datum location. Holes 32 and 36 are oblong in shape and provide x and y axis alignment.

Corner portion 24 contains a mold flow hole 38. The mold flow hole 38 is typically aligned with the gate(s) of the mold and allows plastic material to flow between a first side 40 of the lead frame 10 and a second side 42 of the lead frame 10. In the preferred embodiment, the mold flow hole 38 is square. Although a square mold hole 38 is shown, it is to be understood that other hole shapes can be used in the present invention. It is typically desirable to use a mold hole shape that provides the least amount of fluid resistance.

Figure 2:
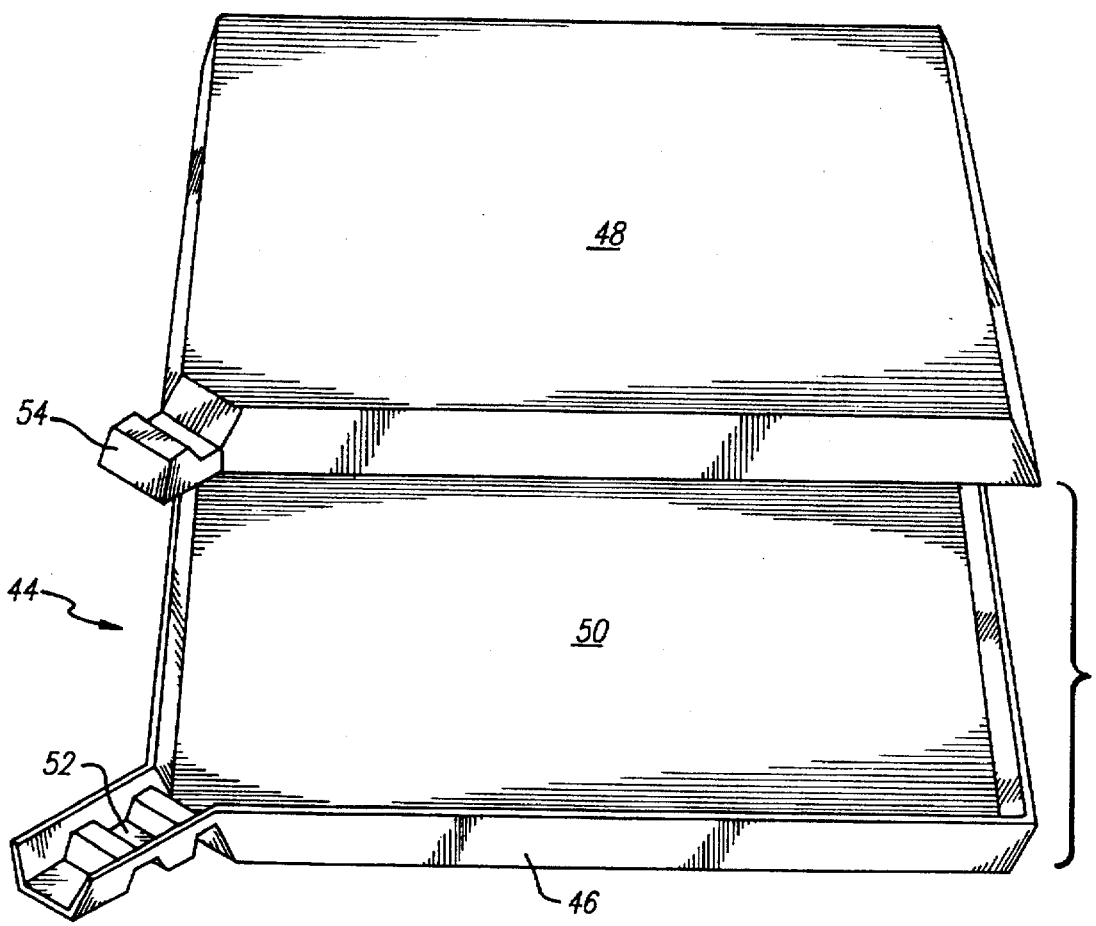
FIG. 2 is a perspective view of a mold of the present invention.

FIG. 2 shows a mold 44 used to form a plastic housing around the die 12. The mold 44 has a base 46 and a cover 48 that can be coupled together to create a mold cavity 50. The base 46 has a first gate 52. The cover 48 has a second gate 54. The gates 52 and 54 provide fluid communication to the mold cavity 50, so that a plastic encapsulant material may be injected into the mold 44. The mold 44 also has alignment pins that align the lead frame 10 with the mold 44. The mold 44 typically has a plurality of cavities 50 so that a number of packages can be created in a single production run. Although the gates 52 and 54 are shown in one corner, it is to be understood that the gates may be in additional corners of the mold.

Figure 3:
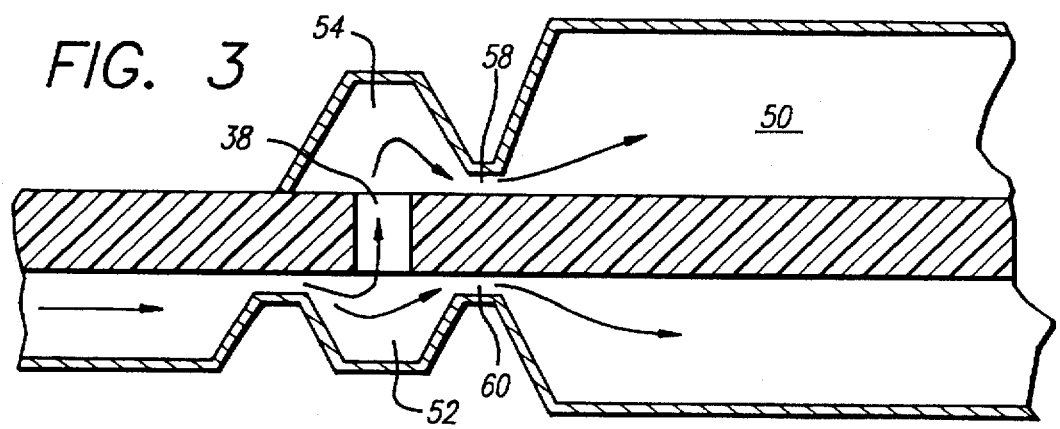
FIG. 3 is a side view of the die and lead frame within the mold and an encapsulant being injected into the mold cavity.

As shown in FIG. 3, to assemble a package, the lead frame 10 is inserted into the mold 44. The lead frame 10 and die 12 divide the mold cavity 50 into a top chamber and a bottom chamber. A plastic encapsulant is injected into the mold cavity through the gates 52 and 54. The encapsulant flows from the first gate 52 and across the first side 40 of the lead frame to fill the bottom chamber. Likewise, the encapsulant flows from the second gate 54 into the mold cavity to fill the top chamber. The mold flow hole 38 allows the plastic to flow between chambers to insure that the die 12 and accompanying lead frame portions are completely covered with encapsulant. The gates 52 and 54, and hole 38 reduce the fluid resistance of the mold cavity 50 and the corresponding injection pressure required to fill the mold. Additionally, the dual gates provide a mold that has essentially equal plastic pressures in each chamber. Equal chamber pressures will prevent an undesirable deflection of the lead frame 10. The gate depths 58 and 60 can also be adjusted to vary the mold flow dependent on the package configuration.

Figure 4:
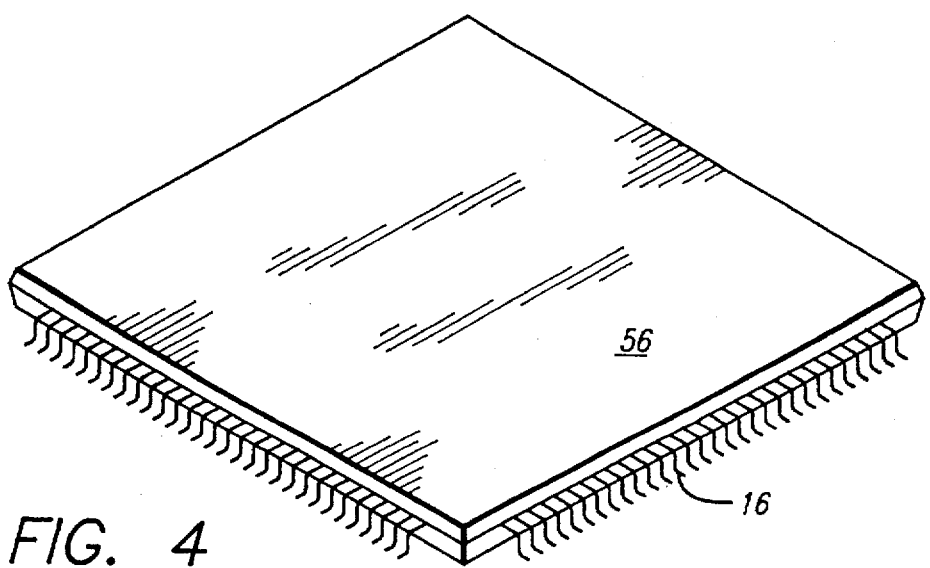
FIG. 4 is a perspective view showing an integrated circuit package.

A predetermined volume of plastic is injected into the mold to fill the mold cavity and to encapsulate the die. The encapsulant is then allowed to cure so that there is formed a hard plastic housing 56. After the plastic is cured, the package is removed from the mold and the outer portion of the lead frame 10 is cut away from the leads. As shown in FIG. 4, the outer portion of the leads and lead frame remain outside of the housing. The leads 16 are then bent to complete the package assembly.

Although two gates are shown and described, it is to be understood that only one gate can be used with the mold flow hole 38 of the lead frame. The mold flow hole 38 allows encapsulant to flow into a chamber that is opposite from the gate. As another embodiment, the gates 52 and 54 can be used without the mold flow hole 38.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for assembling an integrated circuit package, comprising the steps of:

a) placing a die and a lead frame into a mold cavity of a mold to separate said mold cavity into a top chamber and a bottom chamber, said mold having a first gate adjacent to a first side of said lead frame and a second gate adjacent to an opposing second side of said lead frame, wherein the lead frame has a hole that allows fluid communication between said first gate and said second gate; and, b) injecting an encapsulant into said first gate, wherein a portion of said encapsulant flows through said lead frame hole from said first gate to said second gate before said encapsulant flows through said first gate and said second gate and into said top chamber and said bottom chamber across each side of said lead frame and fills said mold cavity to encapsulate said die, wherein said encapsulant flows through said first gate into said top chamber and through said second gate into said bottom chamber in a direction essentially parallel with said first and second sides of said lead frame.

* * * * *

UNITED STATES PATENT AND TRADEMARK OFFICE
CERTIFICATE OF CORRECTION

PATENT NO.    : 5,665,296
DATED         : September 9, 1997
INVENTOR(S)   : Jain et al.

It is certified that error appears in the above-identified patent and that said Letters Patent is hereby corrected as shown below:

In column 2 at line 22 delete "free" and insert --frame--

Signed and Sealed this

Twenty-fifth Day of August, 1998

Attest:

BRUCE LEHMAN

*Attesting Officer*            *Commissioner of Patents and Trademarks*